United States Patent [19]

Blewer et al.

[11] Patent Number: 5,023,200

[45] Date of Patent: Jun. 11, 1991

[54] FORMATION OF MULTIPLE LEVELS OF POROUS SILICON FOR BURIED INSULATORS AND CONDUCTORS IN SILICON DEVICE TECHNOLOGIES

[75] Inventors: Robert S. Blewer; Terry R. Gullinger; Michael J. Kelly; Sylvia S. Tsao, all of Albuquerque, N. Mex.

[73] Assignee: The United States of America as represented by the United States Department of Energy, Washington, D.C.

[21] Appl. No.: 274,892

[22] Filed: Nov. 22, 1988

[51] Int. Cl.⁵ .................................... H01L 21/44
[52] U.S. Cl. ...................... 437/187; 437/33; 437/61; 437/62; 437/170; 156/657
[58] Field of Search ............ 437/187, 62, 61, 33, 437/170; 156/657

[56] References Cited

U.S. PATENT DOCUMENTS

| | | | |
|---|---|---|---|
| 3,919,060 | 11/1975 | Pogge et al. | 204/129.3 |
| 4,016,017 | 4/1977 | Aboaf et al. | 148/187 |
| 4,079,506 | 3/1978 | Suzuki et al. | 29/576 W |
| 4,104,090 | 8/1978 | Pogge | 156/657 |
| 4,149,177 | 4/1979 | Alter | 357/50 |
| 4,380,865 | 4/1983 | Frye et al. | 29/576 W |
| 4,446,476 | 5/1984 | Isaac et al. | 357/67 |
| 4,503,451 | 3/1985 | Lund et al. | 357/50 |
| 4,532,700 | 8/1985 | Kinney et al. | 29/576 W |
| 4,628,591 | 12/1986 | Zorinsky et al. | 156/657 |
| 4,631,570 | 12/1986 | Birrittella et al. | 357/49 |
| 4,801,667 | 3/1989 | Zorinsky et al. | 437/33 |
| 4,835,113 | 5/1989 | Celler et al. | 437/62 |

OTHER PUBLICATIONS

"Complete Dielectric Isolation. . . Porous Silicon", Holmstrom et al., Appl. Phys. Lett. 42(4), Feb. 15, 1983, pp. 386–388.

S. Tsao, "Buried Insulators and/or Conductors in Single-Crystal Silicon Using Porous Silicon Techniques", *Material Research Soc. Symp. Proc.*, vol. 107, 1988, pp. 429–440.

I. Yamada, et al., "Film Deposition and Buried Layer Formation by Mass-Analyzed Ion Beams", *Nuclear Instruments and Methods in Physics Research*, B6, 1985, pp. 439–446.

S. Tsao, et al., "Tungsten Deposition on Porous Silicon for Formation of Buried Conductors in Single Crystal Silicon", *Applied Physics Letters*, vol. 49, No. 7, Aug. 18, 1986, pp. 403–405.

K. Yamazaki, et al., "Fabrication Technologies for Dual 4-KBIT Stacked SRAM", *IEDM*, 1986, pp. 435–438.

Primary Examiner—Brian E. Hearn
Assistant Examiner—Trung Dang
Attorney, Agent, or Firm—Armand McMillan; James H. Chafin; William R. Moser

[57] ABSTRACT

A method of forming a multiple level porous silicon substrate for semiconductor integrated circuits including anodizing non-porous silicon layers of a multi-layer silicon substrate to form multiple levels of porous silicon. At least one porous silicon layer is then oxidized to form an insulating layer and at least one other layer of porous silicon beneath the insulating layer is metallized to form a buried conductive layer. Preferably the insulating layer and conductive layer are separated by an anodization barrier formed of non-porous silicon. By etching through the anodization barrier and subsequently forming a metallized conductive layer, a fully or partially insulated buried conductor may be fabricated under single crystal silicon.

14 Claims, 6 Drawing Sheets

Anodization of Layer 4

Metallization of Layer 4 - Porous Si

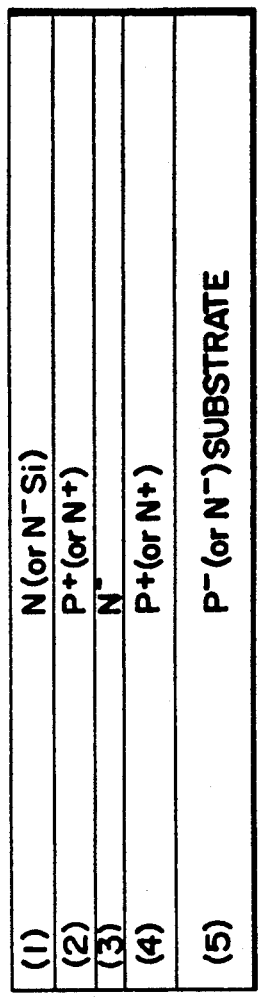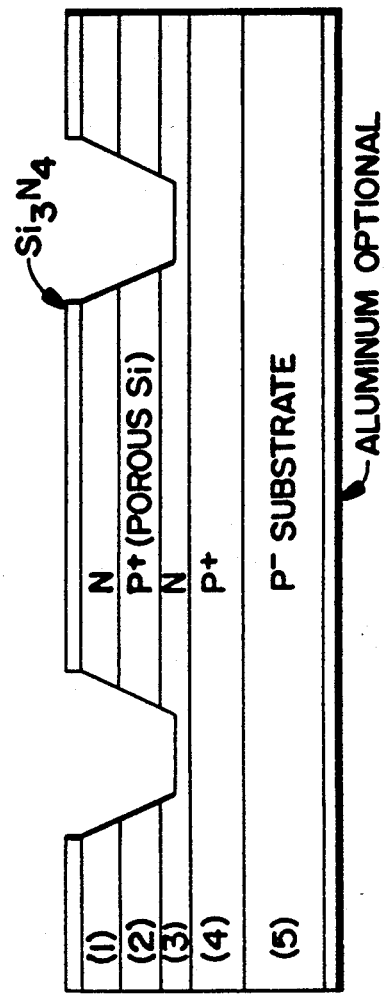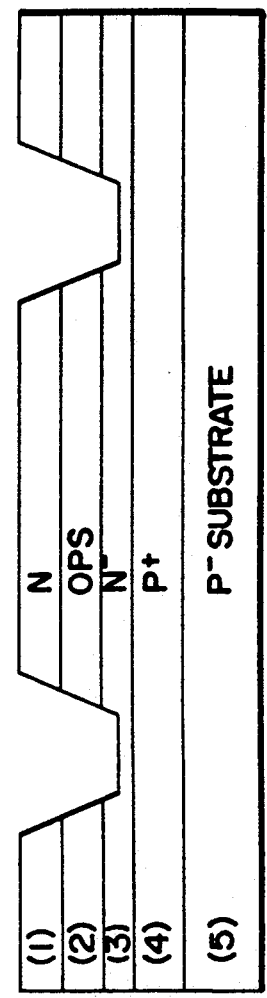
Fig. 2a
Starting Material Doping Profile
Fig. 2b
Anodization of Layer 2 (OPS Layer)
Fig. 2c
Oxidation of Porous Si Anodization of Layer 4

Metallization of Layer 4 - Porous Si

10 μm
i = 10 mA

10 μm
i = 100 mA

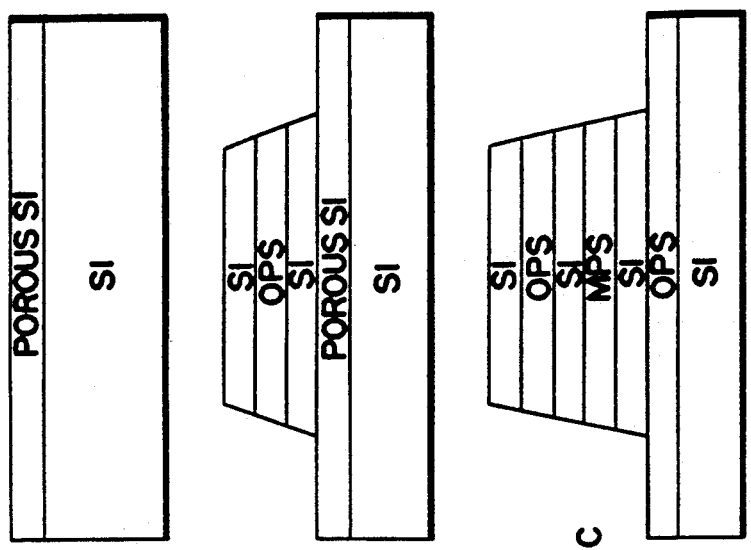
Fig. 6a
Fig. 6b
Fig. 6c
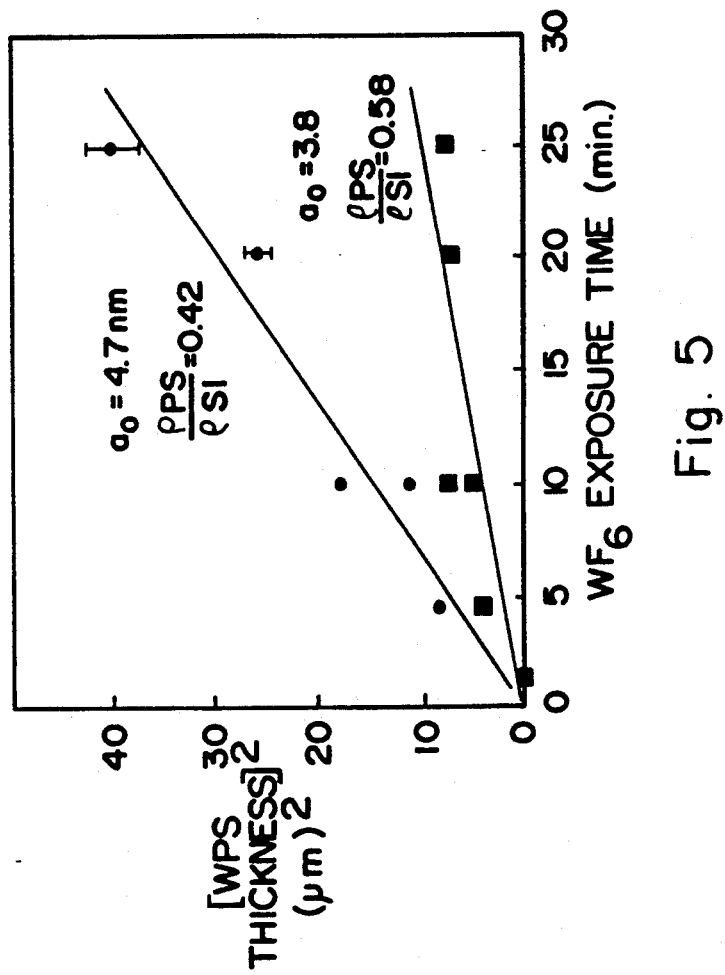
Fig. 5

FORMATION OF MULTIPLE LEVELS OF POROUS SILICON FOR BURIED INSULATORS AND CONDUCTORS IN SILICON DEVICE TECHNOLOGIES

The Government has rights in this invention pursuant to Contract No. DE-AC04-76DP00789 awarded by the U.S. Department of Energy and AT & T Technologies Inc.

BACKGROUND OF THE INVENTION

The present invention relates generally to the formation of multiple levels of porous silicon for buried insulators and conductors in silicon device technologies using porous silicon metallization by chemical vapor deposition. More particularly, the present invention relates to fabrication techniques used to form fully or partially insulated buried conductors under single crystal silicon.

A number of well-established techniques exist for forming buried insulators in silicon and are documented in numerous publications on silicon-on-insulator (SOI) technology. Some of these techniques for forming buried insulators have also been explored for forming buried conductors. Recently, interest has centered around metallized porous silicon for silicon-on-conductor (SOC) fabrication techniques, integrated circuit metallization, and interconnections applications.

Analogous to implantation of oxygen in SIMOX (Separation by Implanted Oxygen) for SOI technology, implantation of metal ions to form buried conductors has also been studied. Implantation of oxygen ions at different energies to form layers of insulators has also been demonstrated. The combined implantation of both oxygen and metal ions at different depths in order to form an oxide-coated metal (i.e., insulated metal) layer, however, has not been reported This method is expected to suffer from technical difficulties worse than the drawbacks plaguing current SIMOX techniques for SOI. It would require a high-energy, high-current implanter capable of metal ion implantation; these implanters are not widely available. Furthermore, this method may also cause damage to the overlying Si. High-temperature annealing of the implantation damage is required. These temperatures are very high, in the range of 1300° C., to achieve a reasonable quality silicon layer after oxygen ion implantation.

Another method for forming buried conductive layers is electrodeposition of metal within porous silicon layers. This method is unsuitable for extended lateral metallization because of pore mouth blockage by the metal deposit.

Another method of forming buried insulated conductors is by recrystallization of amorphous or polycrystalline silicon over an oxide-coated, high-temperature metal layer (e.g., tungsten). This technique has been used to realize three-dimensional integrated SOI circuits. A drawback to this technique is that the silicon quality produced by the recrystallization methods is generally inferior to those produced by the porous silicon methods. Furthermore, the recrystallization methods involve melting of the silicon, and thus require very high temperatures.

Although the SIMOX method is considered to be the frontrunning SOI technique for complementary-metal-oxide-silicon (CMOS) very large scale integrated (VLSI) circuits applications, it is widely recognized that porous silicon-based fabrication techniques offer unique advantages. Porous silicon-based SOI fabrication techniques can be classified into two types: (1) epitaxial deposition techniques, and (2) selective anodization techniques.

Epitaxial deposition techniques are attractive due to the uniformity of the porous silicon layer (PSL) and of the isolated island thicknesses. In these techniques, a uniform blanket layer of porous Si is first formed on the surface of the wafer. The surface PSL, which is single crystal, serves as the seeding layer for epitaxy of a fully dense device Si layer. Trenches are etched through the epitaxial layer down to the PSL, and the underlying PSL is later thermally oxidized through these trenches. Since the current flows in relatively straight parallel paths, the PSL is uniform and its characteristics can easily be adaptable to a variety of applications. A drawback to this method is that non-conventional low-temperature ($<750°$ C.) epitaxy is required to avoid sintering of the pores and maintain their reactivity to oxidation. Low temperature expitaxy techniques such as plasma chemical vapor deposition of $SiH_4$, molecular beam epitaxy (MBE), and liquid phase epitaxy have been used. So far, the crystalline quality of Si overlayers fabricated with this technique have been inferior to those fabricated by the selective buried anodization methods discussed below. Residual defects such as microtwins and dislocations originating from the PSL/epitaxial Si interface have been observed by cross-section transmission electron microscopy (XTEM).

Selective anodization techniques are characterized by selective formation of a porous silicon layer under the device Si layer. Typically, the heavily-doped n-type or p-type layer in $n^-/n^+/n^-$ or $n/p^+/p^-$ doped structures is anodized and subsequently oxidized to form the buried insulator. Selective anodization methods to form silicon-on-insulator structures offer very low defect density device silicon layers, and the ability to form a wide range of overlying silicon and buried oxide layer thicknesses which may be optimized for smart-power applications (thick layers on the order of microns) or for high-speed CMOS applications (thin, less than one micron thick layers).

SUMMARY OF THE INVENTION

It is an object of the present invention to form a partially or fully insulated buried conductor and nearly defectfree silicon device layers using only conventional equipment and low-temperature processing.

The present invention relates to a process scheme of forming multilevels or stacks of porous silicon layers within the same wafer. Controlled, sequential formation of porous silicon multilayers is the first step in being able to form fully or partially insulated buried conductors under single crystal silicon.

In the present invention, a metallization technique such as the low-pressure chemical vapor deposition (LPCVD) of tungsten is used to form a buried conductor layer under single crystal silicon. The use of porous silicon for SOI and metallization applications rely on the enhanced surface area of porous silicon. Practical applications derive from the fact that porous silicon of varying microstructures can be formed selectively within a silicon wafer. Oxidized porous silicon is used to form insulators within silicon devices fabricated according to the present invention.

Although emphasis has been placed on the insulated buried conductor embodiment, the present invention is not limited to fabrication of these structures only. Multi-levels of oxides and/or conductors in various combinations can be potential applications.

BRIEF DESCRIPTION OF THE DRAWINGS

The invention will be described in detail with reference to the attached figures, wherein:

FIGS. 2a-2e illustrate a fabrication process for forming a buried insulated conductor, in single crystal silicon, according to the present invention;

FIG. 5 is a graph of the square of tungsten penetration depths as a function of $WF_6$ exposure time, according to the present invention, for two silicon specimens of different porosities; and FIG. 6 is a schematic representation of a proposed process for forming an insulated buried conductor using sequential formation of porous silicon layers.

DESCRIPTION OF THE PREFERRED EMBODIMENTS

Figure 1:
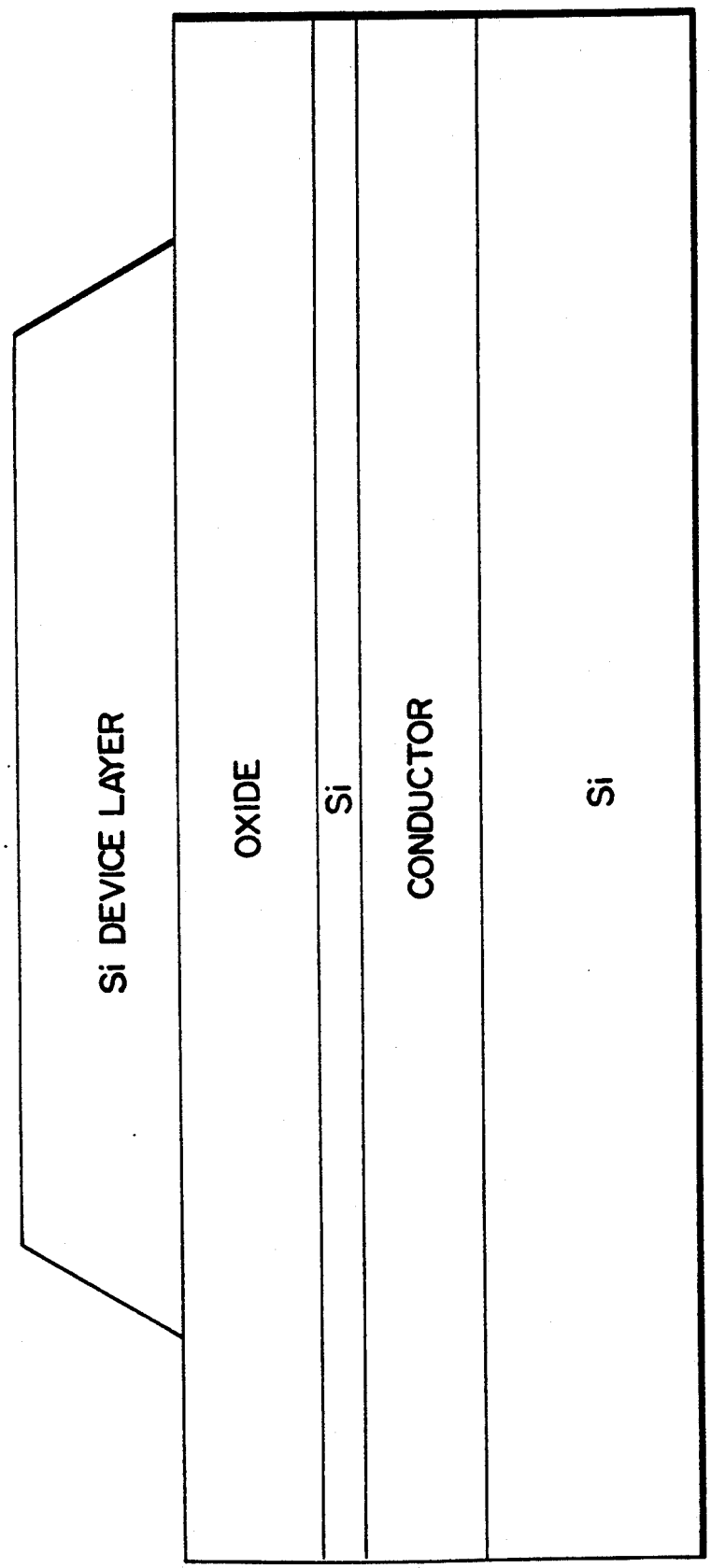
FIG. 1 illustrates the final structure of a buried partially (one side) insulated conductor under single crystal silicon fabricated partially (one side) according to the present invention.

FIG. 1 illustrates the final structure of a partially insulated conductor fabricated according to one embodiment of the present invention. According to such a technique, the insulating side of the integrated circuit is nearest the silicon device layer and the conductive side of the circuit is nearest the supporting substrate. Preferred process steps for fabrication of such a buried insulated conductor under single crystal silicon are shown schematically in FIGS. 2(a)-2(e).

The starting silicon wafer preferably has a dopant profile as shown in FIG. 2(a). This profile may be accomplished by epitaxial deposition of variously-doped layers, by combined conventional dopant implantation and epitaxial deposition, by conventional gaseous dopant infusion or by a combination of these techniques. For clarity, the numbered layers, after processing, will serve the following purposes: layer 1: Si device island, layer 2: oxide, layer 3: anodization barrier, layer 4: conducting layer such as tungsten metallized porous silicon, and layer 5: silicon substrate.

Formation of porous silicon layers as prerequisites to insulating and conducting layers is preferably accomplished by an anodization technique. Anodization in an electrochemical apparatus is one method of forming such porous silicon. Preferably, a hydrofluoric acid solution is used in a concentration of about 20 weight percent. Most preferably, a low applied current density (about 10 mA for a 100 mm diameter wafer) is used to selectively anodize various favorably doped layers and prevent anodization in lower layers.

Once porous Si has been formed, the porous silicon layer (PSL) must be oxidized without generating defects in the island. Thermal oxidation is the preferred method of forming the oxidized porous silicon (OPS) layer. The oxidation treatments are optimized to yield oxidized porous silicon with electrical and physical properties similar to those of thermal oxides. The use of high-pressure oxidation has been reported to eliminate formation of defects and reduce wafer warpage. No oxidation-induced defects were found and wafer warpage was only approximately 2 um in 100 mm diameter wafers (clamped) oxidized at 10 atm. The use of an initial low temperature ($<450°$ C.) treatment to stabilize the pores and thus avoid sintering has been reported to help fully oxidize the PSL. Two-step treatments, with both steps employing high temperatures at atmospheric pressures, have also been found to reduce warpage and defects in the Si overlayer.

Since the thickness of the Si walls between pores is thin, about 10nm, actual oxidation of the PSL is accomplished in short times. However, oxidized porous Si has a very high etch rate in hydrofluoric acid, by as much as an order of magnitude higher than that of thermal oxide. Thus, unless trenches are refilled with a slow-etching material such as polysilicon or densified glass, undensified OPS can pose problems in device processing where HF etches are used routinely. Densification can be accomplished by annealing in steam ambients at sufficiently high temperatures to cause flow of the OPS. Because of the finer pores in p$^-$PSL, densification is accomplished in a few minutes with p$^-$PSL, in contrast to the several hours required for p+ $-$PSL at 1000° C.

Densification of the OPS can also be accomplished in nitrogen ambients. Nitrogen ambient densification is preferred for applications where extensive oxidation of the substrate and the Si device layer must be avoided, as for high-speed thin-film SOI applications. A drawback to nitrogen densification is that it requires longer densification times and higher temperatures than steam densification.

Formation of a buried conductive layer according to the techniques of the present invention involves first forming a buried porous silicon layer. This layer may be formed by the same anodization technique used to form the porous silicon of the insulating layer. The conformal deposition of a masking layer over exposed silicon is necessary, however, to protect the insulating oxide layer from further dissolution. Trenches are etched through the anodization barrier (layer 3) down to layer 4. See FIGS. 2(d) and 2(e). Layer 4 is then anodized to form porous silicon and subsequently metallized.

Tungsten metallization of buried porous silicon layers, which can be used to form the conductive layer 4 above, has been demonstrated. In particular, the reduction of $WF_6$ by Si ($2WF_6 + 3Si \rightarrow 2W + 3SiF_4$), one of several chemical reactions typically used in LPCVD tungsten technology is used. The metallization is achieved by infusing a gaseous form of tungsten metal into the pores of layer 4. When the tungsten hexafluoride gas comes in contact with the silicon of the pore walls, a self-limiting reaction occurs between the $WF_6$ and the Si, leaving a tungsten metal layer coating on the pore walls. This reaction is an attractive first step in porous silicon metallization. First, it is chemically selective with respect to silicon so that tungsten is deposited only on or in silicon layers and not on oxide layers. Second, since the ratio between the volume of silicon consumed to that of tungsten deposited is roughly 2:1, there should be no blockage of pores due to the tungsten deposit. In fact, this reaction should enlarge the pores and enhance penetration of the source gas ($WF_6$) far into the pores. Third, if the distance between pores is short enough, it should be possible to consume all of the silicon between adjacent pores and thus form pure, albeit porous, tungsten. Once the pores are coated with tungsten, additional tungsten can be deposited on the pore surfaces in a second step, using hydrogen reduction of $WF_6$, to increase the tungsten layer thickness (and thus the mechanical integrity) and to reduce electrical resistance.

As shown in FIG. 5, tungsten penetration into the PSL, that is, the amount of the tungsten-porous Si (WPS) formed, increases with increasing exposure times to $WF_6$ with a square-root dependence on deposition time. The penetration depths were greater in the specimens with higher porosity and larger diameter pores. From cross-section transmission electron microscopy (XTEM) and Rutherford backscattering spectroscopy (RBS) measurements of the WPS layers formed on surfaces of Si substrates, there is a uniform concentration of tungsten throughout the reacted layer, terminating in a sharply delineated rear interface between the reacted and unreacted PS. The $t^{\frac{1}{2}}$ dependence, the pore size dependence, and the sharpness of the WPS/PS interface, all strongly suggest a process that is rate-limited by gas phase diffusion through the PS layer itself.

The growing thickness of the WPS layer, $l_{WPS}$, is given by:

$$l_{WPS} = (2D_{eff} t)^{\frac{1}{2}} \qquad \text{Equation (1)}$$

where $D_{eff}$, the effective diffusivity of the process, is given by:

$$D_{eff} = D_p (n \cdot / n_{WPS}) \qquad \text{Equation (2)}$$

Here $D_p$ is the gas diffusivity in the PSL, $n_{2O}$ is the reactant gas concentration just above the wafer geometric surface, and $n_{WPS}$ is the number density of W atoms in the reacted WPS layer. The diffusivity in the PSL, in turn, is given by the Knudsen diffusivity $$D_p = 4/3 a_p (2RT/\pi M)^{\frac{1}{2}} \qquad \text{Equation (3)}$$

where $a_p$ is an effective pore radius, R is the gas constant, T is the absolute temperature, and M is the molecular mass of the transported species ($WF_6$). At a typical deposition temperature of 240° C., the effective diffusivity has the magnitude:

$$D_{eff} = 9.34 \times 10^{-3} a_p p \cdot f_{PS}^{-1} \qquad \text{Equation (4)}$$

where p is the partial pressure of the $WF_6$ and $f_{PS}$ is the density of the PSL relative to that of fully dense silicon. Since the pores in p+PSL tend to be vertically oriented tubes, $a_p$ is expected to be nearly equal to the geometric radius of the pores.

FIG. 5 shows a plot of the square of the tungsten penetration depths as a function of $WF_6$ exposure time for two specimens of different porosities. The fit of equation (1) to the data, with the effective pore radius, $a_p$, as a fit parameter, is also shown in FIG. 5 as the solid lines. The value of $a_p$ obtained agreed well with the average pore radius of the unreacted PSL determined by XTEM. Only about a 25% pore enlargement is expected due to the Si consumption in the reacted layer through which the $WF_6$ diffuses. Moreover, the dependence on pore size is correctly predicted; the larger the pores observed in XTEM the higher the value $a_p$ obtained from the fit. The model prediction that fastest penetration of tungsten into PSL will occur at the highest $WF_6$ partial pressures has also been verified by recent experiments.

Studies have been made on the electrical properties of metallized PSL. For as-prepared WPS layers, resistivities were 2-23 m$\Omega$-cm, 2-3 orders of magnitude higher than the resistivity of fully dense LPCVD tungsten. However, because thick WPS layers (few microns typically) can be formed, sheet resistances obtained are in the range of a few to a few tens $\Omega/°$. From x-ray diffraction studies, it was found that tungsten in as-prepared WPS was in the beta phase. The resistivity of WPS decreased to 0.4-4 m$\Omega$-cm upon annealing at 750° C. under flowing nitrogen-hydrogen gas, which caused transformation of the beta-tungsten to alpha tungsten.

The combination of SOI and SOC techniques using porous Si is the preferred method of fabricating silicon-on-insulated conductor structures according to the present invention. A possible fabrication sequence for such a structure is shown schematically in FIGS. 6(a) and 6(c). First, a shallow layer of porous Si is formed, FIG. 6(a). This layer is then oxidized to form the upper insulating layer. Trenches are then etched deeper, and a second, deeper PSL is created, FIG. 6(b). The upper OPS layer can be protected during the second anodization run by appropriate masking procedures which include silicon nitride layering. Using a technique such as CVD of tungsten, a metallized porous Si (MPS) layer is then formed from the second PSL. Finally, a third PSL is etched and subsequently oxidized to form the bottom insulating layer, FIG. 6(c).

The above multilevel porous Si fabrication sequence may be accomplished by using an n/p+/n/p+/n/p+/p-- doped wafer structure.

A preferred fabrication process illustrated in FIGS. 2(a)-2(e) will now be discussed in detail. First, trenches are etched through layers 1 to 3 but not through 3, i.e., trenches go through the Si device layer down to the anodization barrier the process for formation of which was discussed above, as shown in FIG. 2(b). The figure also shows a masking layer of silicon nitride which was used to define the etched pattern. The p+ or n+ layer of layer 2 can then be anodized in an electrochemical apparatus, and subsequently thermally oxidized, to yield the structure shown in FIG. 2(c).

Figure 2D:
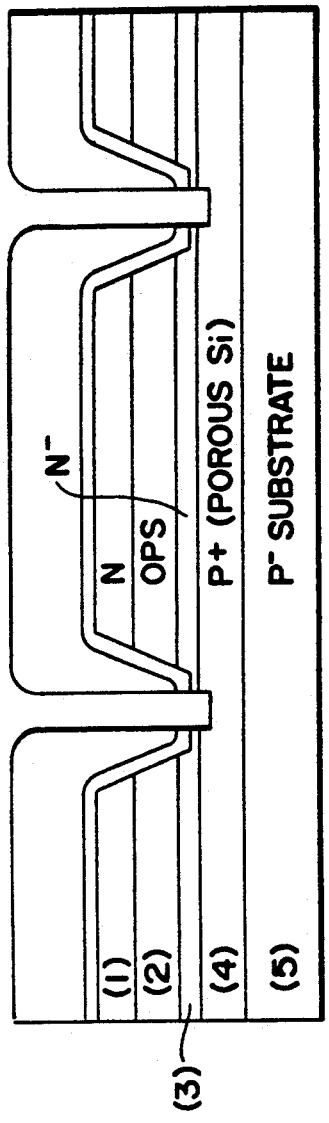
Figure 2E:
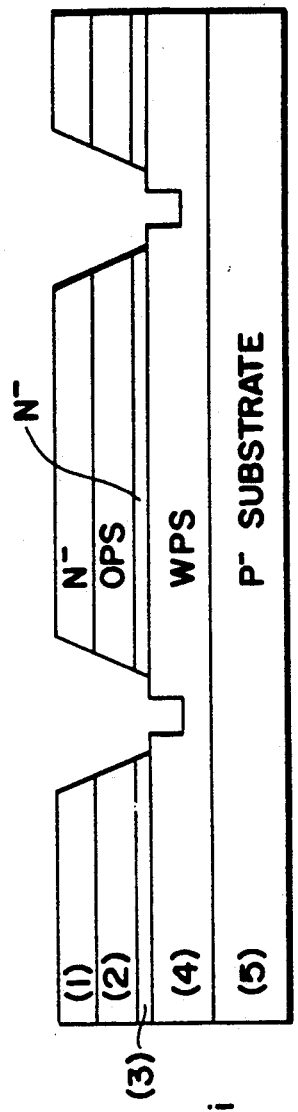

A conformal layer of silicon nitride is then deposited on all the exposed silicon surfaces. The conformal deposition is important in order to protect the oxide layer during the anodization of layer 4. Trenches are then etched through the anodization barrier (layer 3) down to the second p+ or n+ layer (layer 4), as shown in FIG. 2(d). Layer 4 is then anodized in an electrochemical apparatus, and subsequently metallized.

It is important to note that the sequence of porous silicon formation is very important. One must first anodize and react (e.g. oxidize or metallize) the shallowest layer. Otherwise, if the deeper OPS layer is formed first, for example, this insulating layer will prevent electrical contact to the back of the wafer and the anodization process cannot proceed.

A problem with anodization of a multiply-doped silicon wafer using p+ anodization layers as shown in FIG. 2(a) is hole injection from the deeper p+ layer (layer 4) into the anodization barrier layer 3. When this happens, anodization is no longer selective to layer 2. An embodiment of this invention is a means by which this problem has been avoided through appropriate control of and use of sufficiently low current density (about 10 mA for 100 mm diameter wafer) in the anodization of layer 2.

Figure 3:
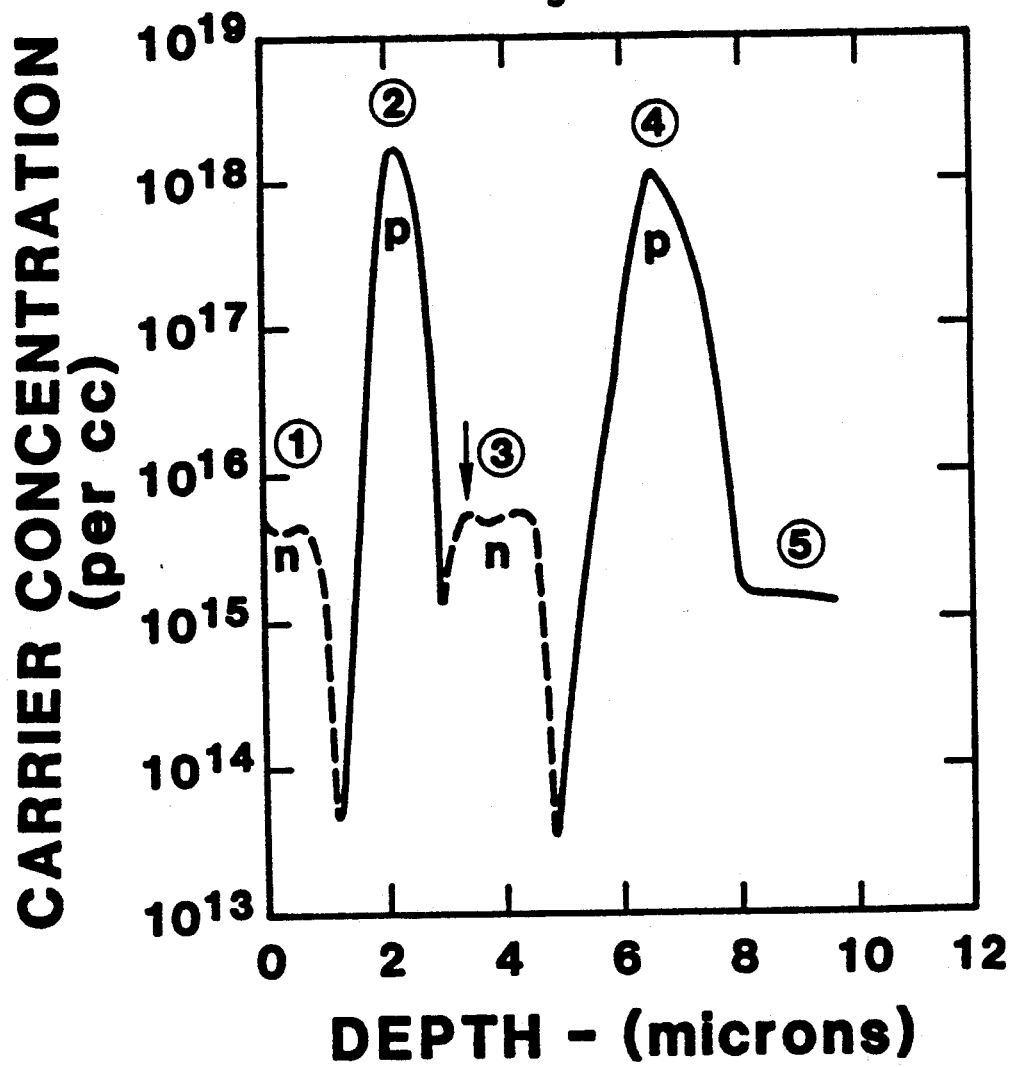
FIG. 3 is a spreading resistance profile of wafers doped according to the present invention.
Figure 4A:
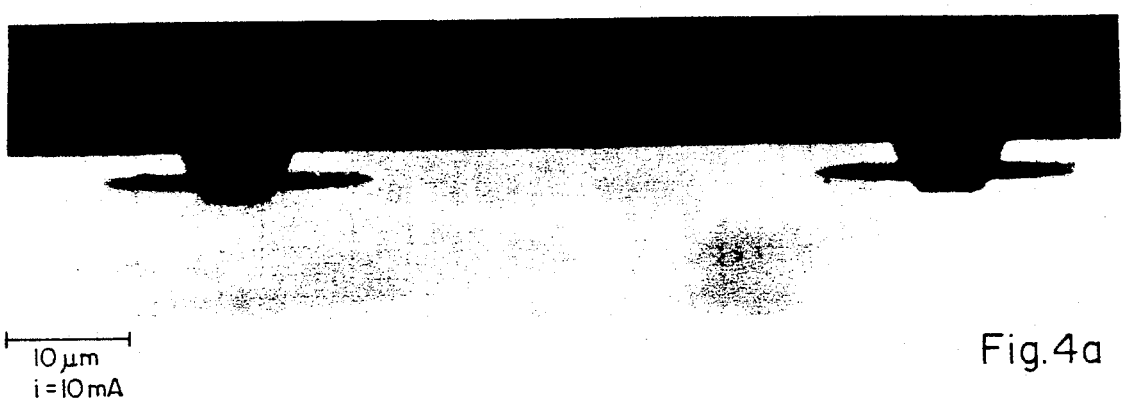
FIGS. 4a-4b are photographs of the resulting anodization at different applied currents of p+ layers 2 and 4 in accordance with the present invention.
Figure 4B:
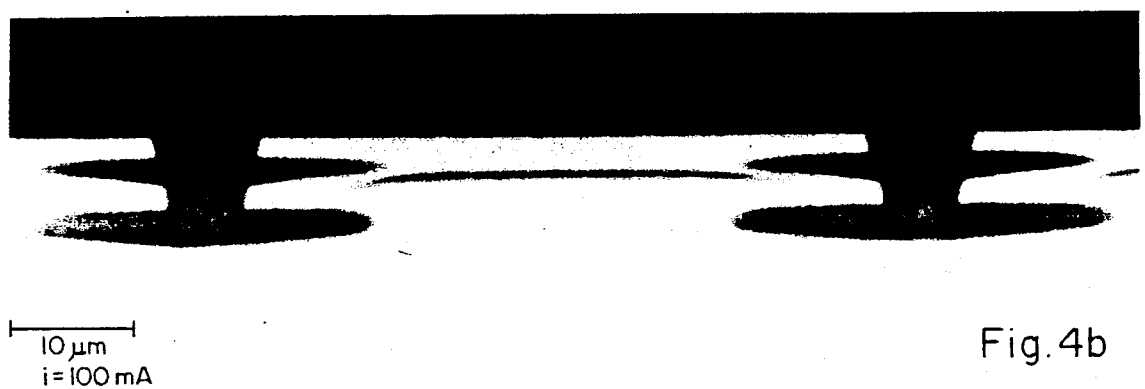

Wafers were doped as shown in the spreading resistance profile in FIG. 3. Trenches were etched to a depth of 3.4 m, into layer 3. Wafers were then anodized in 20% hydrofluoric acid for 20 minutes. When the applied current was 10 mA, anodization was confined to layer 2, as shown in the photograph in FIG. 4(a) When the applied current was 100 mA, anodization selectivity broke down and layer 4 was also anodized as shown in the photograph in FIG. 4(b).

A variety of techniques exist for silicon-on-insulator fabrication using porous Si. The merits and drawbacks of each technique have been discussed. The selective anodization techniques result in silicon overlayers of superior quality than the epitaxial deposition techniques can afford. Buried n+layer anodization results in more uniform device islands and buried oxides than buried p+layer anodization. Porous silicon metallization by nickel electrodeposition and tungsten deposition have been explored. The latter has been shown to be free from pore blockage due to the metal deposit, although the extent of metallization is controlled by the pore diffusion of $WF_6$. Furthermore, tungsten metallization as far as 30 microns into the porous silicon layer, sufficient distance for many circuit applications, has been demonstrated. Finally, fabrication of a silicon-on-insulated conductor has been considered as an extension of the SOI and SOC techniques.

The present invention has been described in detail, including alternative embodiment thereof. It will be appreciated, however, that those skilled in the art, upon consideration of the present disclosure, may make modifications and improvements on this invention and still be within the scope and spirit of this invention as set forth in the following claims.

What is claimed is:

1. A method of fabricating a silicon-on-insulated conductor structure for semiconductor integrated circuits, comprising the steps of:
   (a) forming multiple levels of porous silicon on a silicon substrate;
   (b) selectively oxidizing at least one porous silicon layer to form an insulating layer;
   (c) forming at least one conductor layer beneath said insulating layer by metallizing at least one layer of said porous silicon other than said insulating layer.

2. A method of fabricating a multiple level porous silicon substrate for semiconductor integrated circuits, comprising the steps of:
   (a) oxidizing a first layer of porous silicon to form an insulator layer on top of an anodization barrier formed by a non-porous silicon layer in said silicon substrate;
   (b) etching through said insulator layer and anodization barrier;
   (c) forming a second porous silicon layer underneath said anodization barrier; and
   (d) metallizing said second porous silicon layer to form a buried conductor layer beneath said insulator layer.

3. A method according to claim 2, wherein said first layer of oxidized porous silicon is masked prior to etching by a masking procedure.

4. A method according to claim 3, wherein said masking procedure is a silicon nitride layering procedure.

5. A method according to claim 2, wherein said second porous silicon layer is metallized by chemical vapor deposition.

6. A method according to claim 5, wherein a source gas for said chemical vapor deposition is a metal-based gas.

7. A method according to claim 6, wherein the source gas for said chemical vapor deposition is a tungsten based gas.

8. A method according to claim 7, wherein the source gas for said chemical vapor deposition is $WF_6$.

9. A method according to claim 2, wherein said method further comprises the steps of etching through said metallized porous silicon layer and subsequently oxidizing an underlying base layer to form an insulating base layer.

10. A method according to claim 2, wherein at least one of said first and second porous silicon layers is formed by anodization in an electrochemical apparatus.

11. A method according to claim 10, wherein said at least one of said first and second layers is selectively anodized by using a low applied current density to prevent hole injection.

12. A method according to claim 10, wherein said insulation layer is selectively anodized with a hydrofluoric acid solution.

13. A method according to claim 12, wherein said solution is about 20 weight % hydrofluoric acid.

14. A method according to claim 2, wherein said insulator layer of porous silicon is oxidized by anodizing said insulator layer in an electrochemical apparatus and subsequently thermally oxidizing said insulator layer.

* * * * *